US006977603B1

(12) United States Patent
Barna et al.

(10) Patent No.: US 6,977,603 B1
(45) Date of Patent: Dec. 20, 2005

(54) NONLINEAR FLASH ANALOG TO DIGITAL CONVERTER USED IN AN ACTIVE PIXEL SYSTEM

(75) Inventors: Sandor Barna, Pasadena, CA (US); Daniel Van Blerkom, Valencia, CA (US); Eric R. Fossum, La Crescenta, CA (US)

(73) Assignee: Micron Technology, Inc., Boise, ID (US)

( * ) Notice: Subject to any disclaimer, the term of this patent is extended or adjusted under 35 U.S.C. 154(b) by 57 days.

(21) Appl. No.: 09/711,379

(22) Filed: Nov. 9, 2000

Related U.S. Application Data

(62) Division of application No. 09/161,355, filed on Sep. 25, 1998, now Pat. No. 6,295,013.

(51) Int. Cl.[7] .................................................. H03M 1/12

(52) U.S. Cl. ....................... 341/155; 341/118; 341/120

(58) Field of Search ................................ 341/120, 140, 341/138, 137, 135, 155–172, 122, 123, 118; 348/572

(56) References Cited

U.S. PATENT DOCUMENTS 4,146,882 A * 3/1979 Hoff et al. .................. 341/138
5,059,980 A * 10/1991 Katzenstein ................ 341/159
5,220,398 A * 6/1993 Horn et al. .............. 250/206.2
5,343,201 A * 8/1994 Takayama et al. .......... 341/200
5,691,821 A * 11/1997 Hieda et al. ............. 348/217.1
5,877,715 A * 3/1999 Gowda et al. .............. 341/122
5,880,691 A * 3/1999 Fossum et al. ............. 341/162
5,982,318 A * 11/1999 Yiannoulos ................. 341/155
5,995,163 A * 11/1999 Fossum ...................... 348/572
6,060,760 A * 5/2000 Tan ............................ 257/536

FOREIGN PATENT DOCUMENTS

JP 6-276538 * 9/1994

OTHER PUBLICATIONS

Carbona et al, “Stochastic-Flash Analog-to-Digital Conversion,” IEEE, 1998.*
Kawahito et al, “A Compressed Digital Output CMOS Image Sensor . . . ,” IEEE, 1997.*
Tanner et al, “An 8-bit Low-Power ADC Array for CMOS Image Sensors,” IEEE, 1998.*

* cited by examiner

*Primary Examiner*—Michael Tokar
*Assistant Examiner*—Linh V. Nguyen
(74) *Attorney, Agent, or Firm*—Dickstein Shapiro Morin & Oshinsky LLP

(57) ABSTRACT

A non-uniform resistor is used with a flash A to D converter in order to provide an A to D output which is not linear. The nonlinearity of the A to D output is specially designed to carry out a predetermined correction of the signal.

26 Claims, 6 Drawing Sheets

NONLINEAR FLASH ANALOG TO DIGITAL CONVERTER USED IN AN ACTIVE PIXEL SYSTEM

RELATED APPLICATION

This application is a Divisional of Ser. No. 09/161,355 filed on Sep. 25, 1998 (U.S. Pat. No. 6,295,013 public on Sep. 25, 2001).

BACKGROUND

The present application relates to an active pixel sensor with an embedded A to D converter. More specifically, the present application describes using a flash A to D converter that has a nonlinear aspect.

FIG. 1 shows standard input/output curves of a video monitor. Curve 100 is an ideal I/O characteristic which would be completely linear between input and output. However, it is well known that most monitors have a more realistic characteristic shown as curve 102. The lower end of the brightness scale has less gain. The upper end of the scale blooms and cuts off.

These characteristics lead to a known complementary correction being applied to the output of image devices. This correction usually has two components: a gamma (γ) correction at the lower end and knee correction at the upper end. Curve 104 shows these conventional corrections. The gamma correction increases the contrast at the lower end of the signal range to compensate for reduced gain at the lower end of the monitor responsivity characteristic. The knee correction extends the dynamic range of the monitor at the upper end.

These corrections can be done in many different ways. One correction uses nonlinear CMOS diodes which operate as nonlinear resistors. However, these processes are difficult to fabricate reliably in a CMOS process. Another way is by using a digital signal processor.

The correction must be applied at video rates, thus necessitating fast signal processing for digital output sensors.

SUMMARY OF THE INVENTION

The present system defines using an A to D converter which has an embedded correction as part of its circuitry.

BRIEF DESCRIPTION OF THE DRAWINGS

These and other aspects will now be described in detail with reference to the accompanying drawings, wherein.

DESCRIPTION OF THE PREFERRED EMBODIMENTS

Figure 1:
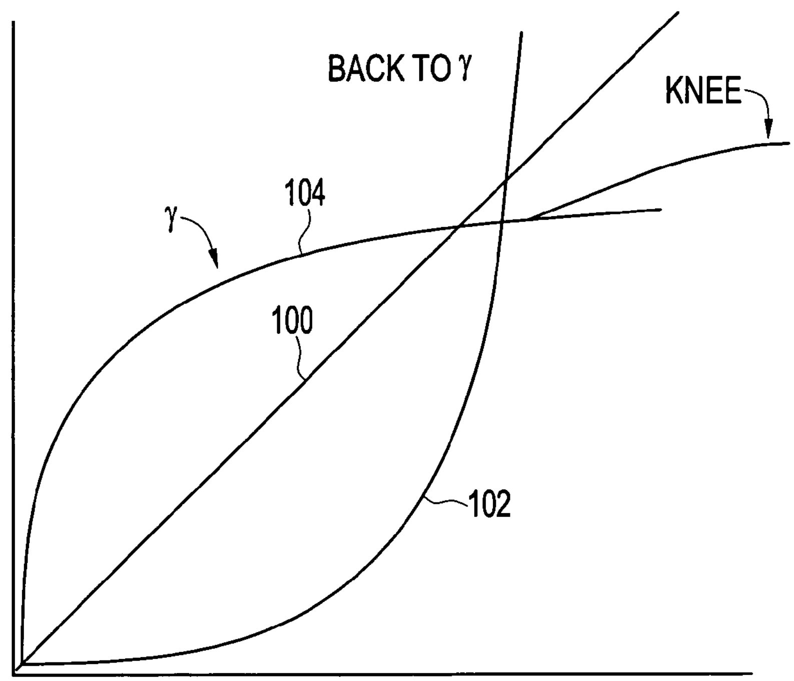
FIG. 1 shows a standard correction system for correcting gamma and knee correction in a video system.
Figure 2:
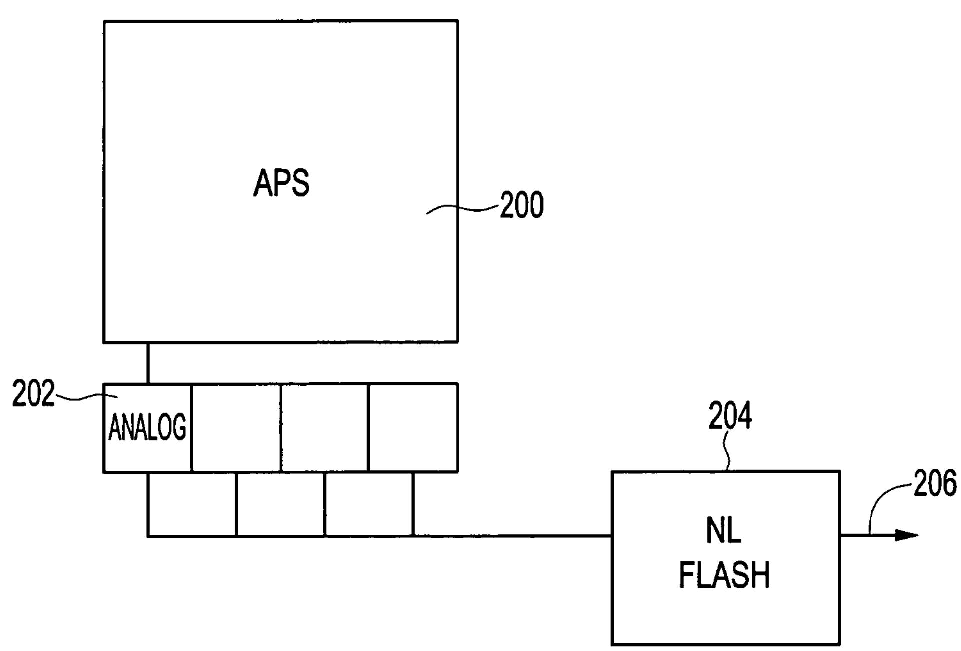
FIG. 2 shows the basic architecture block diagram of the preferred system.

An embodiment of the embedded system is shown in FIG. 2. Array 200 is an array of active pixel sensors of the type described in U.S. Pat. No. 5,471,515, the disclosure of which is herewith incorporated by reference to the extent necessary for proper understanding. A semiconductor substrate is formed with an image sensor, e.g., an array of photodiodes, photogates, pinned photodiodes, or, less preferably CCDs or charge injection devices (CIDs) any other image acquisition structure. Each column of the array of the active pixel sensor 200 is associated with an analog processing circuit 202, also formed on the same substrate. The analog processing circuit is shown in further detail in FIG. 3. The analog processor removes fixed pattern noise to produce an output that is amplified and fixed-pattern-noise-reduced. The output is A to D converted on the same substrate, by a flash A to D converter, as described herein.

Figure 3A:
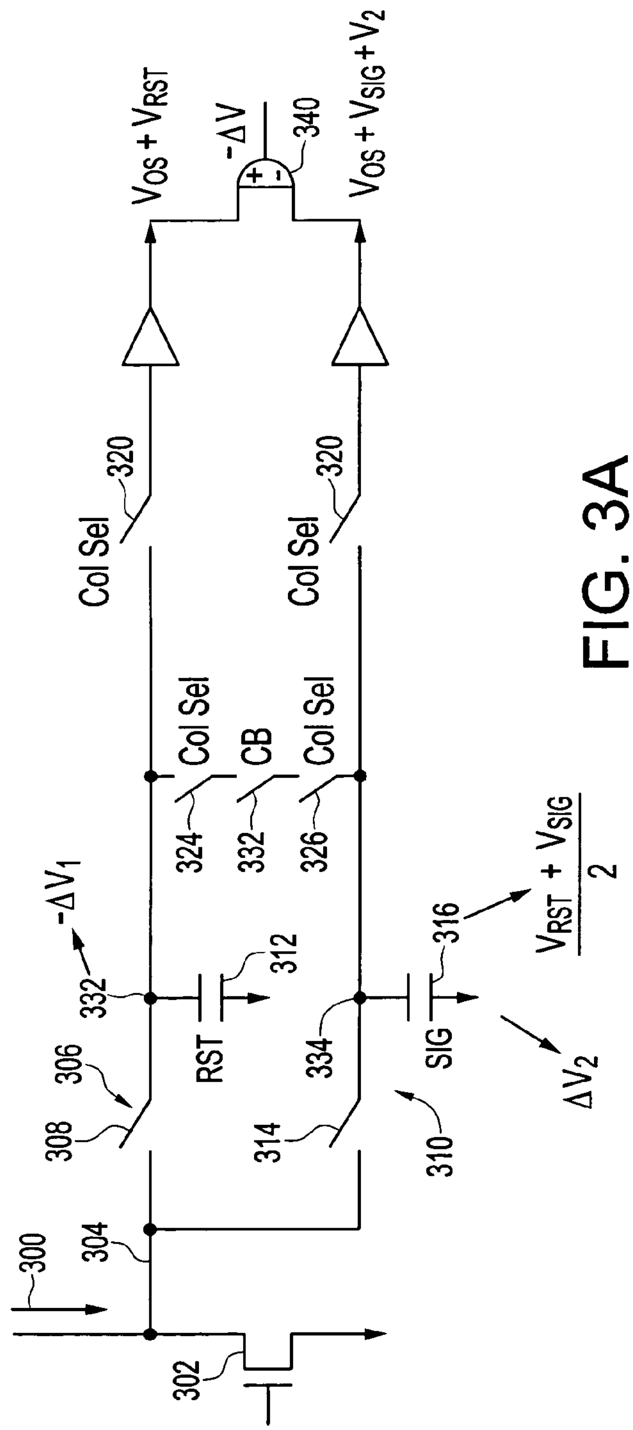
FIG. 3 shows details of the noise reduction circuit which is used.
Figure 3B:
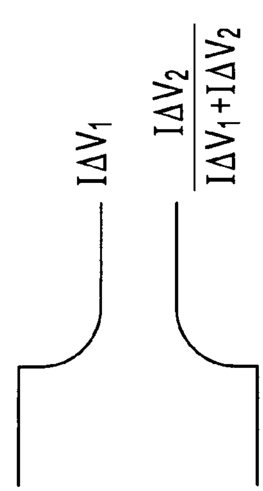
Figure 3C:
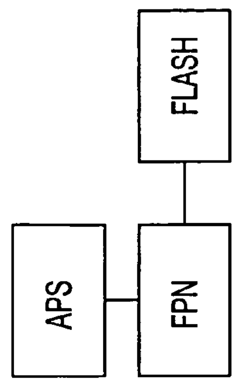

The analog processing circuit of FIG. 3 operates as follows. The signal 300 from the pixel is buffered by a first transistor 302 to form a buffered signal 304. The buffered signal 304 is applied to two parallel circuit parts: a reset leg 306 and a signal leg 310.

The reset leg 306 samples the reset level of the active pixel. The switch 308 is closed to sample the reset level onto capacitor 312. Then, the switch 308 is opened, leaving the reset level charged on the capacitor.

At some subsequent time, the signal switch 314 is closed thereby sampling the signal level onto the sample capacitor 316. The switch is then opened to leave the signal level charged on the capacitor 316.

A column is selected by closing the column select switches, shown as 320, 322, 324, and 326, in unison. This selects the column for use and applies the reset and signal values to the differential amp. At sometime thereafter, the crowbar switch 330 is closed. This has the effect of shorting together the nodes 332 and 334 respectively of the capacitors 312, 316. The voltage on capacitor 312 is $V_{os}+V_{rst}-\Delta V$, and on capacitor 316 is $V_{os}+V_{site}+\Delta V_2$. Hence, the result output voltage becomes the average of the reset voltage (R) and the signal voltage (S) divided by two (R+S)/2. In this way, all offsets are canceled out leaving only a voltage related to the signal minus reset.

The output of the analog processor is then multiplexed to a flash Type A to D converter 204. The flash converter is preferably of the nonlinear type as described herein. The flash converter operates at high speed to analog-to-digital convert the applied signal to form output 206.

The flash converter can be of any desired type. However the preferred flash converter has a non-linear output characteristic.

Figure 4:
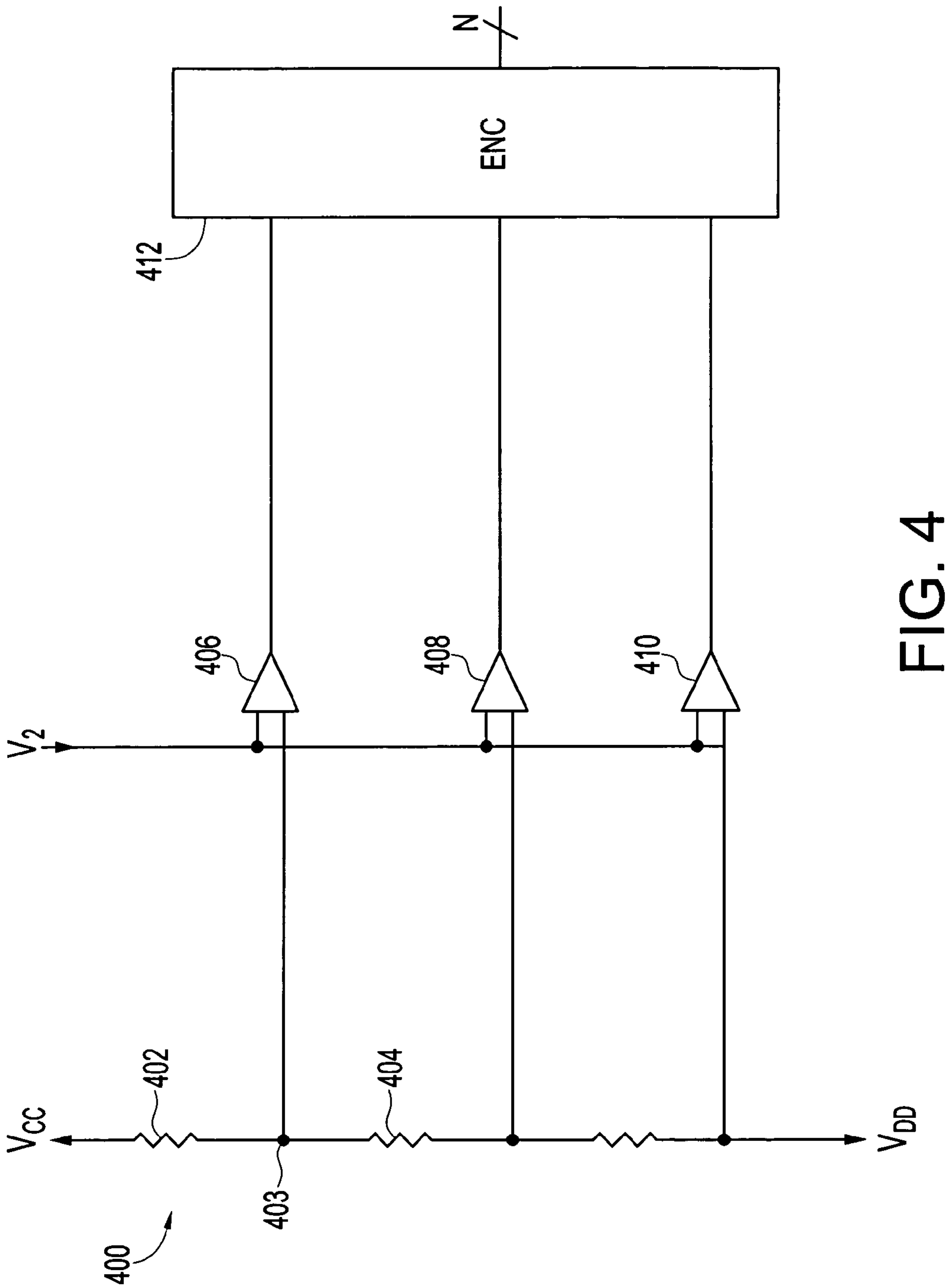
FIG. 4 shows a simplified block diagram of a flash-type A-to-D converter.

A flash converter has the basic structure shown in FIG. 4. A resistor string 400 includes $2^n$ resistors 402, 404, where n is the desired number of bits to resolution. Each two adjacent resistors has a tap 403 therebetween. The voltage on each tap represents a specific voltage in the resistor chain based on Vcc, Vdd, and the resistances above and below the tap. The input voltage $V_2$ to be flash-converted is coupled in parallel to $2^n$ comparators shown as 406, 408, 410. The comparators' output is either "1" or "0" depending on whether the input voltage to be flash-converted is greater than or less than the corresponding voltage applied thereto from the resistor ladder. Hence, the place where the voltage on the comparator outputs change from "0" to "1" represents the location of the incoming analog signal.

This position is encoded by encoder 412 to form an N bit digital output where $2^n$ equals the number of resistors 402, 404. This is well known in the art.

Figure 5:
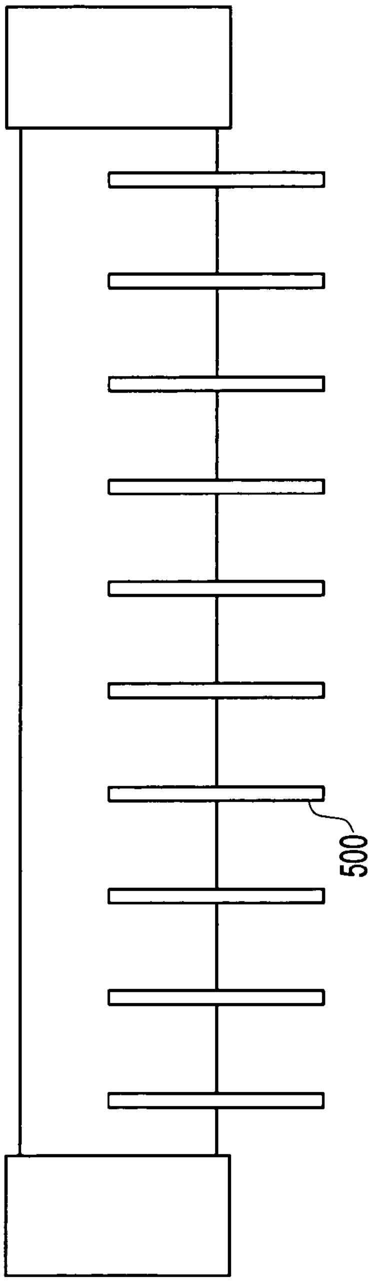
FIG. 5 shows a prior art diagram of a prior art resistor used in a flash converter.
Figure 6:
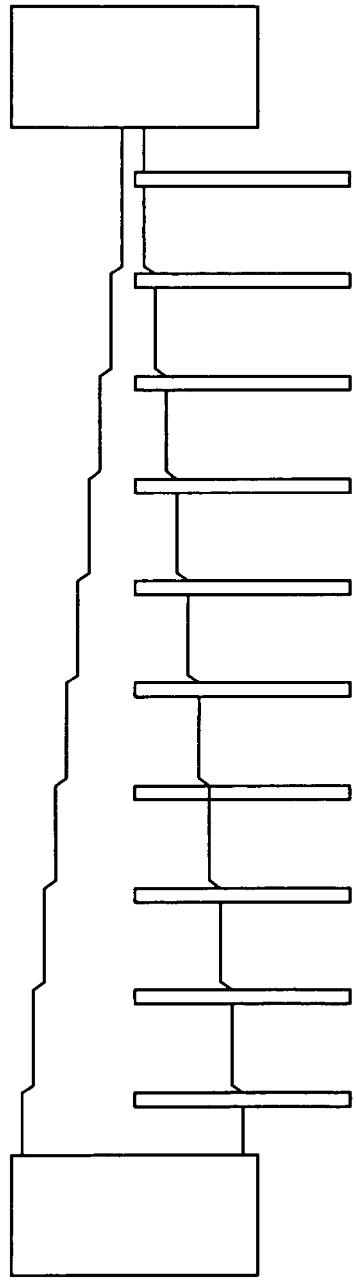
FIG. 6 shows the nonuniform resistor used in a flash converter according to the present system.

The resistor is typically formed from a length of polysilicon or other resistive material with a known resistance. The taps 500 are attached to different locations along the polysilicon 502 as shown in FIG. 5. This resistor is typically uniform, in the sense the resistance between any two adjacent taps is the same as the resistance between any other two adjacent taps, limited only by the resolution of the fabrication. FIG. 6 shows the resistor used in a preferred embodiment. According to this preferred embodiment, a non-uniform resistor is used in the flash A to D converter. The resistor is nonuniform in the sense that the resistance drop across some taps is different than the voltage drop across others of the taps. This nonuniform resistor forms reference voltages which are pre-weighted for both gamma correction and knee correction. The weighting is done according to known correction values.

Figure 9:
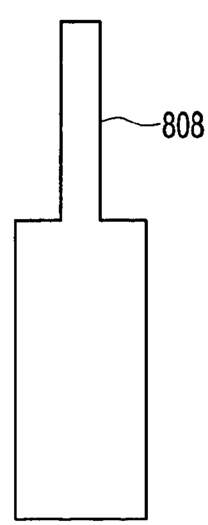
FIG. 9 shows a resultant resistor used according to this teaching.

The non-uniform resistor shown in FIG. 6 has a number of taps which are used to feed reference voltages to the comparators of the flash converter. The resistor shown in FIG. 6 is substantially wedge shaped, and hence the resistance between each two taps is different. Alternative embodiments include a discontinuous resistor such as shown in FIG. 9, explained herein. Another possibility is a resistor having the shape like that in FIG. 5, but varying spacing between the taps, to thereby vary the resistance between two adjacent taps. This nonuniform resistance allows the converter to carry out not only A to D conversion, but at the same time any predetermined weighting characteristic which can be coded into a resistive network, preferably gamma and knee correction.

While this embodiment describes the correction being used for gamma and knee correction, it should be understood that other corrections are also possible.

A second embodiment recognizes that it is difficult to implement a true gamma function in an analog circuit. The continuous gamma function is approximated by a piece wise linear curve. Hence, this second embodiment forms the gamma function using a piece-wise linear curve with a flash A to D converter that has a nonuniform resistor.

For example, let the resistance between tap point I and I—be such that $Ri=5\times10^{-4}i^2+0.5$.

Figure 7A:
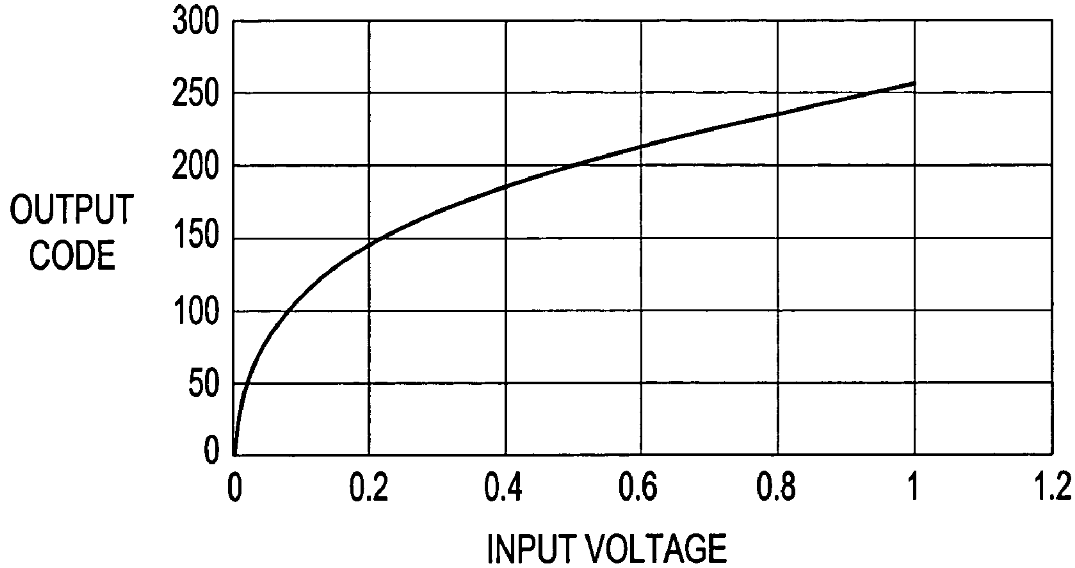
FIGS. 7A and 7B show respective input voltages for different kinds of resistors.
Figure 7B:
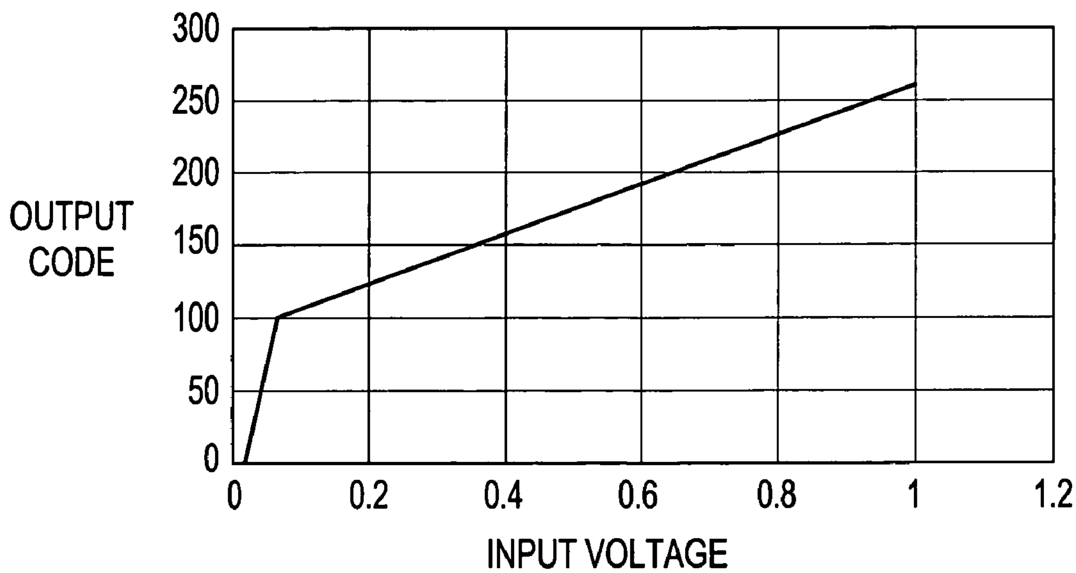

For 1V reference voltage across the resistor string, a total current of about 0.3 milliamps flows, making the total resistance about 3 K5L. The resultant non-linear characteristic of the full flash A to D converter becomes as shown in FIG. 7A.

Figure 8:
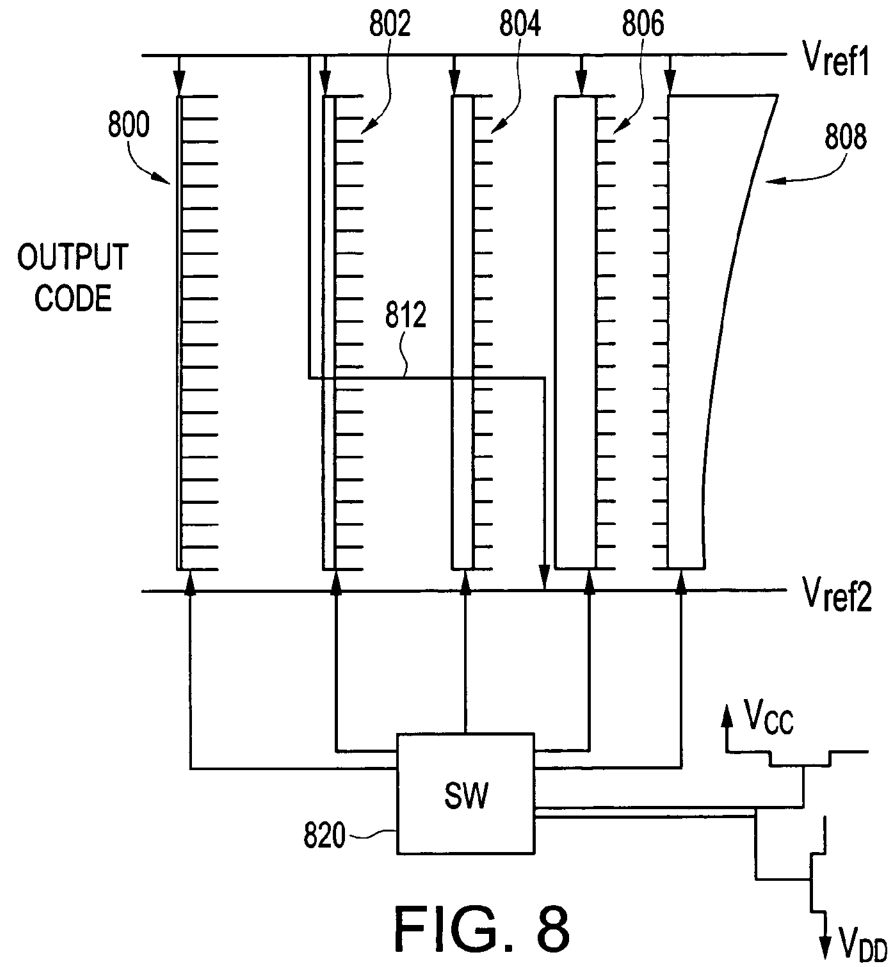
FIG. 8 shows another embodiment of the resistor system used in the flash converter of the present invention.

Implementation of a piecewise linear transfer function can be carried out by dividing the resistor string into two portions. An embodiment of this system is shown in FIG. 8. FIG. 8 shows five different resistor parts labeled as 800, 802, 804, 806, and 808. A switching network 820 is connected to each of the resistor parts, and is used to switch between any tap on any one resistor and any tap on any other resistor. The switching network can include a plurality of switchable transistors, each transistor connected to one of the taps, and a number of switching transistors connected to each of the switched transistors. The way in which a switching embodiment of this type would be implemented is well known in the art. The advantage is that this switching element enables any tap to be connected to any other tap.

As shown, each of the spaces between tap on 800 have a resistance of R1, and each of the taps on 802 have a different resistance R2. Similarly, the taps on 804 and 806 have different resistances. A variable tap resistor 808 could also be used as shown.

The connection line 812 schematically shows the way in which the resistors are connected to form the gamma correction. The first n taps are from resistor 802, and the next m taps are from resistor 806. This produces an equivalent resistor to that shown in FIG. 9. These different resistors and resistor parts hence could be used and connected together to form any desired biasing element to the flash converter part, and hence any desired kind of compensation or correction. The switching network 820 also includes, as shown, connections to the positive voltage Vcc and to the negative voltage Vdd. Hence, each resistor string can be connected or disconnected to any reference value at any location.

The total resistance, therefore, can become any desired resistance at any desired form.

The total resistance, therefore, becomes nR1+mR2; the total number of taps being n+m.

Several resistor chains are formed. Each has a characteristic value of ohms per tap which is constant or non constant. Each resistor string is either disconnected from or connected to either voltage reference value. Each tap may also be optionally connected across a tap point to another resistor.

The system shown in FIG. 8 hence includes a number of different switching elements. A connection may therefore pass through one or more different strings as desired. This enables forming different transfer functions depending on any desired characteristic. The transfer function can also be dynamically changed. For example, I the gamma/knee function described above, the knee point could be dynamically adjusted by switches 500–510.

In the first characteristic, each resistor string has a constant number of ohms per tap. This allows a piecewise linear characteristic to be generated. The knee point and gamma point may be programmably adjusted.

Any non constant ohms per tap will give a portion of the string that is non-linear.

This approach allows the characteristic of the A to D converter to be adjusted on the fly, and hence allows gamma correction to be adjustable easily during sensor operation as the scene changes.

Although only a few embodiments have been described in detail above, other embodiments are contemplated by the inventor and are intended to be encompassed within the following claims. In addition, other modifications are contemplated and are also intended to be covered.

What is claimed is:

1. An image sensor, comprising:

a single substrate:

an image sensor part formed on said substrate adapted to receive a plurality of signals indicative of an image;

an analog to digital converter, also formed on said substrate coupled to said image sensor part, and adapted to convert said signals indicative of said image to a digital form, said analog to digital converter further including a resistive portion having a plurality of resistive areas, at least one said area being adapted to produce a non-linear bias adapted to change the digital output signal, wherein said analog to digital converter substantially simultaneously compares one of said plurality of signals indicative of an image with a plurality of reference voltages; and a correlated double sampling element, formed on said substrate, and carrying out a correlated double sampling operation using said plurality of signals and providing an output to said analog to digital converter;

wherein said analog to digital converter is a flash analog to digital converter which uses a resistive ladder that is non-uniform.

2. An image sensor system, comprising:

a single substrate;

an image sensor part formed on said substrate adapted to receive a plurality of signals indicative of an image: and an analog to digital converter, also formed on said substrate coupled to said image sensor part, and adapted to convert said signals indicative of said image to a digital form, said analog to digital converter further including a resistive portion having a plurality of resistive areas, at least one said area being adapted to produce a non-linear bias adapted to change the digital output signal, wherein said analog to digital converter substantially simultaneously compares one of said plurality of signals indicative of an image with a plurality of reference voltages;

wherein said analog to digital converter is a flash analog to digital converter which uses a resistive ladder that is non-uniform, and said resistive ladder includes a plurality of different resistive ladders with a switching network that selects a resistance ladder from among said plurality of resistive ladders.

3. A flash analog to digital converter system, comprising:

a resistive ladder, having a plurality of resistive portions, and a plurality of connective taps between said resistive portions, said resistive ladder biased with a voltage such that a voltage drop across at least one of said pair of taps is different than a voltage drop across another of said pair of taps, and is different in a predefined way which includes correction for a predetermined image characteristic, wherein said resistive ladder is formed of a resistive material with connective taps, connected to different portions of said resistive material, said resistive material having a different resistance per unit area at one portion than at another portion;

a plurality of comparators, each receiving an input signal to be converted, and respectively connected to a tap from said resistive ladder; and an analog-to-digital encoder, determining a digital signal from outputs of said comparators.

4. A system as in claim 3, wherein said resistive material is polysilicon.

5. A system as in claim 3, wherein resistances from said resistive ladder are non-uniform in a way that codes a gamma correction and a knee correction for correcting white level compression into an output signal.

6. A system as in claim 3 wherein said resistive material changes from a thinner portion to a thicker portion from one end to another end, such that resistance per unit length is changed from said one end to another end.

7. An analog to digital converter system, comprising:

a resistive ladder having a plurality of resistive portions, at least one of said resistive portions having a different resistive value than another of said resistive portions, and a plurality of connective taps disposed between said resistive portions, said resistive ladder being adapted to be biased with a voltage such that a voltage drop across at least a pair of said taps is different than a voltage drop across another pair of said taps, and is different in a predefined way which includes correction for a predetermined image characteristic;

a switching network controlling a switched connection between said resistive portions so that one of said resistive portions can be placed in series with at least one other of said resistive portions;

a plurality of comparators, each receiving an input signal to be converted, and connected to a tap from said resistive ladder; and an analog-to-digital encoder, determining a digital signal from outputs of said comparators.

8. A method of acquiring an image, comprising:

producing an output signal whose level relates to a number of photons received from an image;

determining a desired correction factor for the image from among a plurality of different correction factors;

selecting one of a plurality of different weighting functions based on said desired correction factor; and analog to digital converting said signal using an analog to digital converter including a resistive material disposed in a width varying over distance, said converter producing an output that is not linear relative to its input, said output being weighted according to a predetermined weighting function.

9. A method as in claim 8, wherein said analog to digital converter is a flash analog to digital converter which is weighted according to the desired function.

10. A method as in claim 9, wherein said weighting is carried out by using one of a plurality of different resistors.

11. A method as in claim 10, wherein one of said plurality of resistors is a constant resistance resistor, and another of said plurality of resistors is a variable resistor.

12. An image acquisition unit, comprising:

a semiconductor substrate;

an image sensor element, formed on said substrate, and producing an output indicative of an image;

an analog to digital converter formed on said substrate and having a non-uniform resistor having a length and a width, said width varying along said length, said analog to digital converter receiving said output indicative of the image and converting the output to a digital value based on a non-linear conversion characteristic produced by said non-uniform resistor, whereby the output of the analog to digital converter non-linearly corresponds to the output according to a predetermined correction factor which is a piecewise linear curve, wherein said analog to digital converter is a flash converter, and a correlated double sampling noise reduction circuit formed on said substrate.

13. An image acquisition unit, comprising:

a semiconductor substrate;

an image sensor element, formed on said substrate, and producing an output indicative of an image; and an analog to digital converter formed on said substrate and having a non-uniform resistor having a length and a width, said width varying along said length, said analog to digital converter receiving said output indicative of the image and converting the output to a digital value based on a non-linear conversion characteristic produced by said non-uniform resistor, whereby the output of the analog to digital converter non-linearly corresponds to the output according to a predetermined correction factor which is a piecewise linear curve, wherein said analog to digital converter is a flash converter; and a correlated double sampling noise reduction circuit, formed on said substrate coupled between said image sensor element and said analog to digital converter.

14. An image acquisition unit, comprising:
a semiconductor substrate;
an image sensor element, formed on said substrate, and producing an output indicative of an image; and
an analog to digital converter formed on said substrate and having a non-uniform resistor having a length and a width, said width varying along said length, said analog to digital converter receiving said output indicative of the image and converting the output to a digital value based on a non-linear conversion characteristic produced by said non-uniform resistor, whereby the output of the analog to digital converter non-linearly corresponds to the output according to a predetermined correction factor which is a piecewise linear curve, wherein said analog to digital converter includes said resistor used for carrying out the analog to digital conversion operation, and wherein said resistor includes a plurality of different resistance elements, and a switching part which switches between said different resistance elements to form said piecewise linear curve.

15. A method of acquiring and processing an image using a single substrate device, comprising:
acquiring analog data indicative of pixels of the image, using correlated double sampling;
coupling said analog data to a flash analog to digital converter; and
flash converting said analog data to digital form, wherein said flash converting comprises converting non-linearly by selecting resistances whereby the output of the analog to digital converter corresponds to the analog data according to a predetermined correction factor and wherein said predetermined correction factor is represented by a piecewise linear curve.

16. A method as in claim 15, further comprising:
forming multiple resistor elements with different resistances; and
connecting among said multiple resistor elements to form a non-linear reference for the flash analog to digital converter.

17. A method as in claim 15, wherein said predetermined correction factor is for at least one of gamma or knee correction.

18. A method as in claim 15, wherein said converting comprises switching between different resistance parts to form said piecewise linear curve.

19. An image sensor and processing device, comprising:
a semiconductor substrate;
an image sensor portion, formed on said substrate, and having a plurality of pixel elements, each producing one or more analog output signals indicating sensed information that is indicative of a number of photons impinging thereon, said image sensor portion including a noise reduction circuit therein, which reduces an amount of noise in the analog output signals of said image sensor portion;
a flash analog to digital converter system, also formed on said substrate and receiving said analog output signals from said image sensor portion, and having:
a) a resistive ladder, having a plurality of resistive portions each with a respective resistance, said respective resistances differing from one another, and a plurality of connective taps between said resistive portions, said resistive ladder biased with a voltage such that a voltage drop across at least a pair of said taps is different than a voltage drop across another pair of said taps, and is different in a predefined way adapted to correct for a predetermined image characteristic;
b) a plurality of comparators, receiving respectively said analog output signals from said image sensor portion, and connected to a respective tap of said resistive ladder to compare said analog output signals to a voltage on said tap and produce an output indicative thereof; and
c) an analog-to-digital encoder, determining a digital signal from outputs of said comparators, to thereby produce a digital output signal which is corrected for said predetermined characteristic.

20. A device as in claim 19, wherein said noise reduction circuit is a correlated double sampling circuit.

21. A device as in claim 19, wherein said resistive ladder includes a polysilicon resistor with different taps thereon.

22. A device as in claim 19, wherein said polysilicon resistor has varying dimensions such that a resistance per unit area is different at one part of said polysilicon resistor than it is at another part of said polysilicon resistor, and wherein said taps are evenly spaced on said polysilicon resistor.

23. A device as in claim 19, wherein said taps are unevenly spaced on said polysilicon resistor.

24. A device as in claim 19, further comprising a second resistive ladder, and a switch for switching between use of said first and second resistive ladders.

25. A method of acquiring and processing an image, comprising:
acquiring analog data indicative of pixels of the image;
determining one of a plurality of different transfer functions to be used for said analog data;
selecting a compensation network within an analog to digital converter including a non-uniform resistor having resistive properties which vary from one area of said resistor to another area of said resistor for the one different transfer function being used for said analog data; and
analog to digital converting said analog data according to said different transfer function.

26. An image sensor comprising
a substrate;
an image sensor circuit formed on said substrate;
an analog to digital converter coupled to said image sensor circuit formed on said substrate, said analog to digital converter having a nonlinear resistor with a non-uniform resistive property and a switching section for selectively combining resistive portions of said nonlinear resistor, said analog to digital converter adapted to receive a signal from said image circuit and being adapted to selectively convert said signal into an output signal including a nonlinear bias using said nonlinear resistor.

* * * * *

UNITED STATES PATENT AND TRADEMARK OFFICE

CERTIFICATE OF CORRECTION

PATENT NO. : 6,977,603 B1
DATED : December 20, 2005
INVENTOR(S) : L. Barna et al.

It is certified that error appears in the above-identified patent and that said Letters Patent is hereby corrected as shown below:

Column 3,
Lines 3-4, “signal. [New paragraph] This position” should read -- signal. [Continue paragraph] This position --.

Column 8,
Lines 22 and 28, “claim 19” should read -- claim 21 --.

Signed and Sealed this

Eleventh Day of April, 2006

JON W. DUDAS
*Director of the United States Patent and Trademark Office*